(12) United States Patent
Chiang

(10) Patent No.: US 8,553,424 B2
(45) Date of Patent: Oct. 8, 2013

(54) LOCKING DEVICE AND ELECTRONIC DEVICE ENCLOSURE USING THE SAME

(75) Inventor: Tsung-Hsun Chiang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 381 days.

(21) Appl. No.: 13/071,467

(22) Filed: Mar. 24, 2011

(65) Prior Publication Data

US 2012/0127680 A1 May 24, 2012

(30) Foreign Application Priority Data

Nov. 23, 2010 (TW) .................................. 99140289

(51) Int. Cl.
*H05K 5/00* (2006.01)
(52) U.S. Cl.
USPC ............................ 361/759; 361/801; 361/809
(58) Field of Classification Search
USPC .................. 361/759, 679, 728–730, 752, 796, 361/800–802, 807, 809, 810
See application file for complete search history.

(56) References Cited

U.S. PATENT DOCUMENTS

| 5,383,793 | A  | * | 1/1995  | Hsu et al. ....................... 439/327 |
| 6,409,518 | B1 | * | 6/2002  | Hung .............................. 439/61 |
| 6,885,565 | B2 | * | 4/2005  | Shi ................................ 361/801 |
| 7,149,094 | B2 | * | 12/2006 | Li .................................. 361/801 |
| 7,787,258 | B2 | * | 8/2010  | Cheney et al. ................. 361/801 |

* cited by examiner

*Primary Examiner* — Hung S Bui
(74) *Attorney, Agent, or Firm* — Altis & Wispro Law Group, Inc.

(57) ABSTRACT

An exemplary electronic device enclosure includes a box, a mainboard having a plurality of slots, a card having a bottom end fixed in one slot of the mainboard, and an opposite top end, and a locking device. The locking device includes a fixing member and an engaging member. The fixing member includes a plurality of first teeth. The engaging member includes a plurality of second teeth matching with the first teeth, a bottom of the engaging member having a cutout defined therein, and the cutout adapted for receiving an edge of the card. The engaging member is operable so that the second teeth engage with various of the first teeth, whereby a location of the engaging member is adjustable relative to the location of the fixing member, and thereby the engaging member is capable of engaging with the card when the card is at different locations.

17 Claims, 4 Drawing Sheets

LOCKING DEVICE AND ELECTRONIC DEVICE ENCLOSURE USING THE SAME

BACKGROUND

1. Technical Field

The present disclosure relates to locking devices, and particularly to a locking device for locking electronic elements and an electronic device enclosure using the locking device.

2. Description of Related Art

Usually, an electronic device enclosure such as that of a personal computer includes a box. The box accommodates electronic elements, such as a mainboard, therein. Users can add a graphics card, sound card, or Ethernet card onto the mainboard for enhancing the functions of the personal computer.

The card is supported in such a manner that solely a bottom end of the card is inserted into a slot of the mainboard. In assembly, transport or use, vibration or shaking is liable to occur. When this happens, the card may deform and suffer damage.

What is needed, therefore, is an electronic device enclosure having a locking device which can overcome the above-described problems.

DETAILED DESCRIPTION

Figure 1:
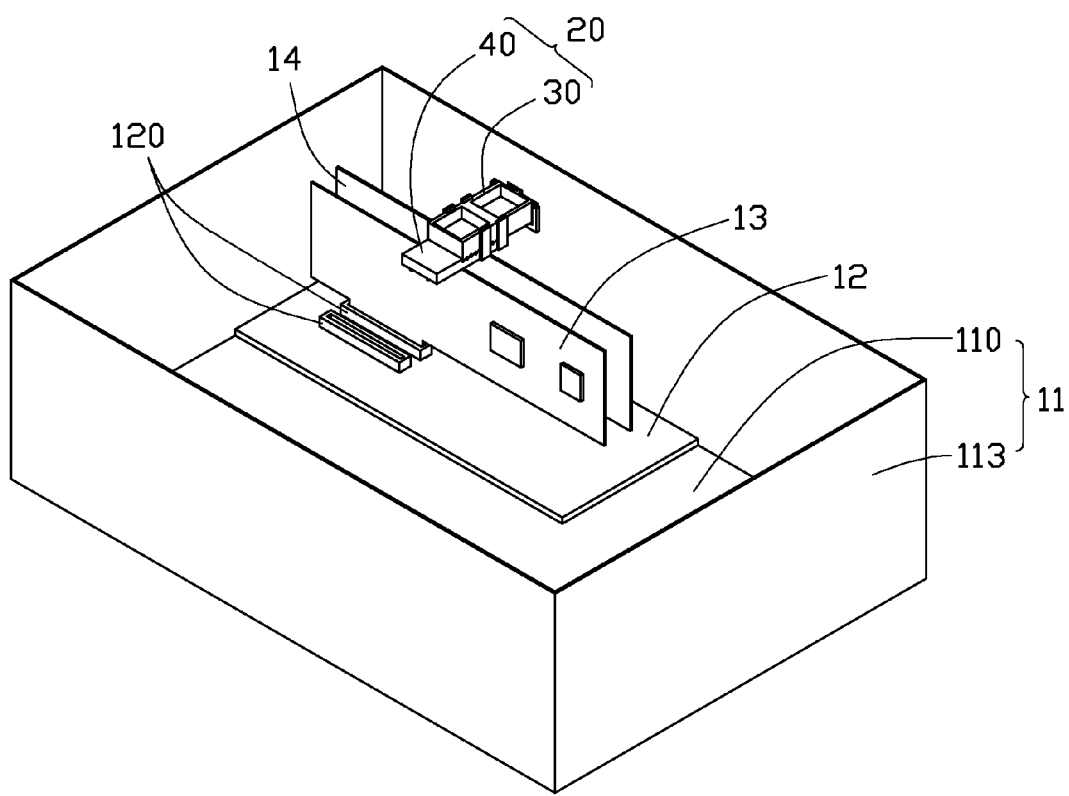
FIG. 1 is an isometric view of an electronic device enclosure in accordance with an exemplary embodiment of the disclosure, showing two cards secured in the electronic device enclosure by a locking device.

An electronic device enclosure in accordance with an exemplary embodiment of the present disclosure is a personal computer. Referring to FIG. 1, the electronic device enclosure comprises a box 11, a mainboard 12 received in the box 11, a first card 13 mechanically and electrically fixed on the mainboard 12, a second card 14 mechanically and electrically fixed on the mainboard 12 and located adjacent to the first card 12, and a locking device 20 assembled in the box 11 for securing the first and second cards 13, 14 in the box 11.

The box 11 comprises a rectangular base 110, and a peripheral sidewall 113 extending upwardly from four sides of the base 110. The mainboard 12 is horizontally mounted on the base 110. A plurality of slots 120 are formed on the mainboard 12. The first card 13 and the second card 14 are uprightly engaged with two adjacent slots 120 of the mainboard 12. The first card 13 and the second card 14 are spaced from and parallel to each other.

Figure 2:
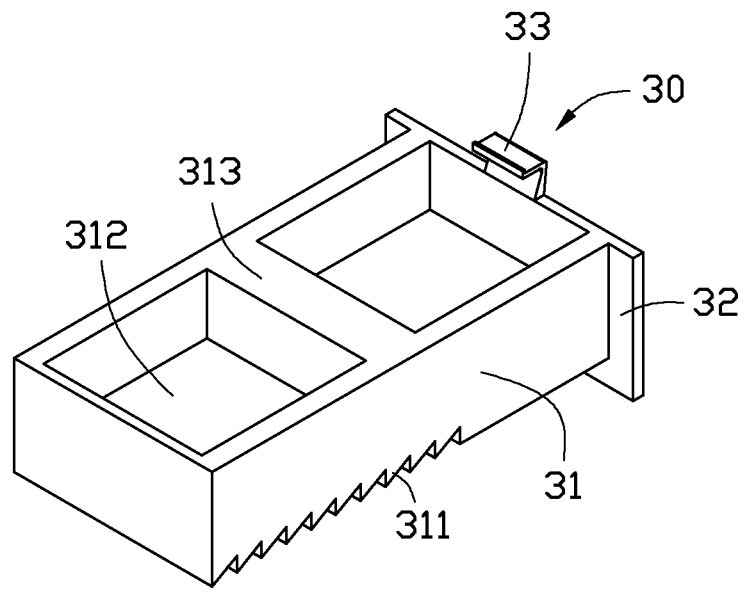
FIG. 2 is an exploded, enlarged view of the locking device of the electronic device enclosure of FIG. 1.
Figure 2:
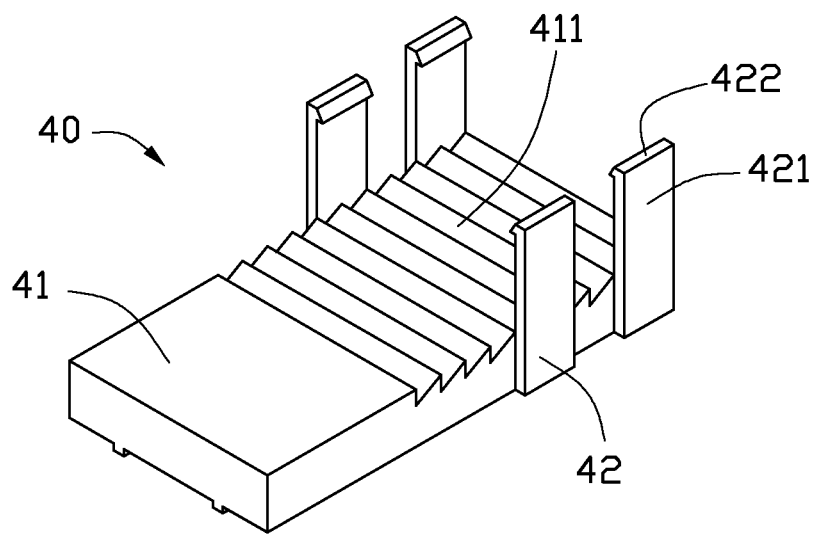
Figure 3:
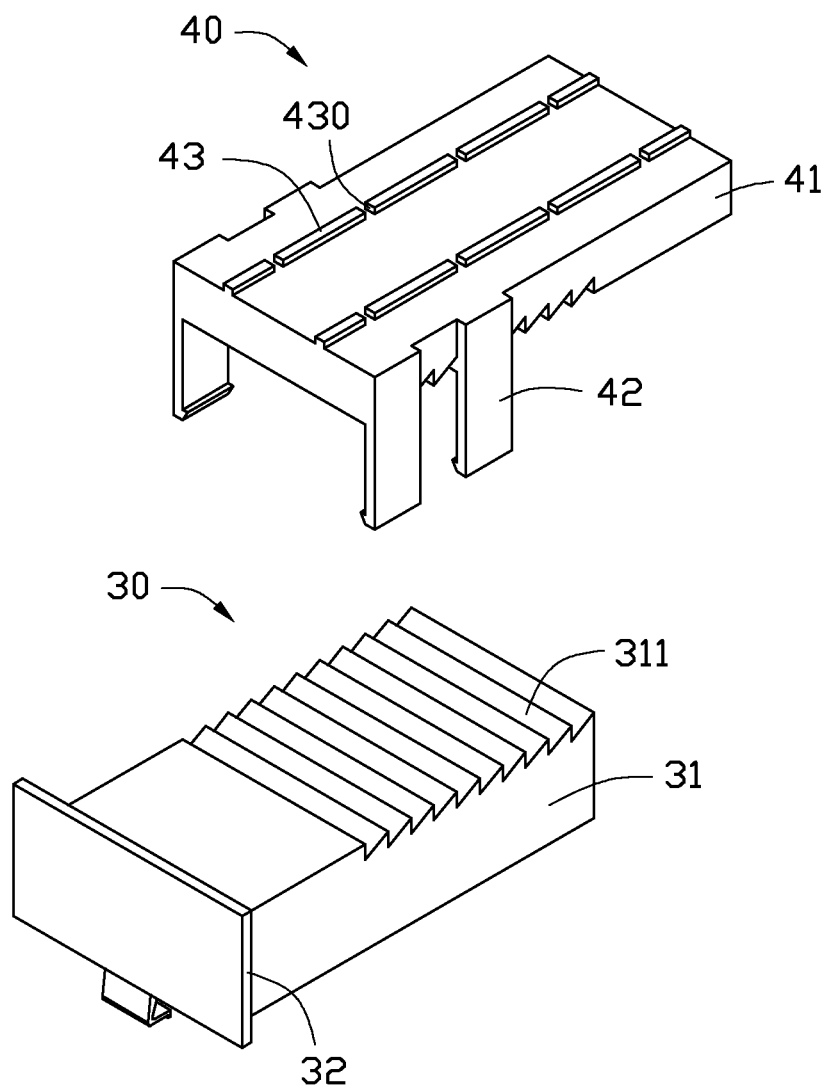
FIG. 3 shows the locking device of FIG. 2 inverted.

Referring also to FIGS. 2 and 3, the locking device 20 comprises a fixing member 30 and an engaging member 40 engaging with the fixing member 30. The fixing member 30 comprises an elongated main body 31, a flange 32 extending outwardly from a periphery of an end of the main body 31, and an elastic piece 33 extending upwardly from an end of a top face of the main body 31. A plurality of continuous first teeth 311 are defined in a bottom face of the main body 31 along a lengthwise direction of the main body 31. The first teeth 31 are the same as each other, and each of the first teeth 31 extends along a widthwise direction of the main body 31. Two spaced recessed portions 312 are defined in a top face of the main body 31, whereby a bridge 313 is formed between the two recessed portions 312.

The engaging member 40 comprises an elongated body 41, two pairs of elastic arms 42 respectively extending upwardly from two opposite lateral sides of the body 41, and a plurality of baffle ribs 43 extending downwardly from a bottom face of the body 41. A plurality of continuous second teeth 411 are defined in a top face of the body 41 along a lengthwise direction of the body 41, to match with the first teeth 311 of the fixing member 30. The second teeth 411 are the same as each other. Each of the elastic arms 42 comprises an upright portion 421, and a hooking portion 422 extending inwardly from a top end of the upright portion 421. The baffle ribs 43 are divided into two groups. The baffle ribs 43 of each group extend along the lengthwise direction of the body 41, and are substantially collinear. The two groups of baffle ribs 43 are arranged symmetrically, parallel to and spaced from each other. A cutout 430 is defined between every two adjacent baffle ribs 43 of each group. A width of the cutout 430 is substantially equal to that of the cards 13, 14. A distance between every two adjacent cutouts 430, i.e., a length of each baffle rib 43, is equal to a distance between each two adjacent slots 120 of the mainboard 12.

In assembly, the fixing member 30 is disposed on the engaging member 40. The bottom face of the main body 31 is attached on the top face of the body 41, and the first teeth 311 engagingly mesh with the second teeth 411, whereby the engaging member 40 is restricted to move relative to the fixing member 30 along the lengthwise direction of the main body 31. The main body 31 of the fixing member 30 is sandwiched between the upright portions 421 of the elastic arms 42, and the hooking portions 422 of the elastic arms 42 abut against the top face of the main body 31, whereby the fixing member 30 and the engaging member 40 are secured together. The engaging member 40 can be operated so that the second teeth 411 of the engaging member 40 engage with different first teeth 311 of the fixing member 30, whereby a distance by which the body 41 extends outwardly relative to the main body 31 along the lengthwise direction of the main body 31 is adjustable. Such adjustability is according to a predefined scale, as determined by the dimensions of the first teeth 31 and the second teeth 411.

In use, the locking device 20 is located above the mainboard 12 on which the first and second cards 13, 14 are mounted. The fixing member 30 of the locking device 20 is fixed to an inner face of the sidewall 113 of the box 11 by the flange 32 and the elastic piece 33. The engaging member 40 is secured to the fixing member 30. The engaging member 40 is disposed on the first card 13 and the second card 14. A top end of the first card 13 is correspondingly inserted into two cutouts 430 of the engaging member 40, and a top end of the second card 14 is correspondingly inserted into another two cutouts 430 of the engaging member 40, whereby the first and second cards 13, 14 are secured to the box 11 by the locking device 20. Typically, a top edge of the first card 13 is engaged in the two cutouts 430, and a top edge of the second card 14 is engaged in the other two cutouts 430. Thus, the electronic device enclosure has good vibration resisting performance.

Figure 4:
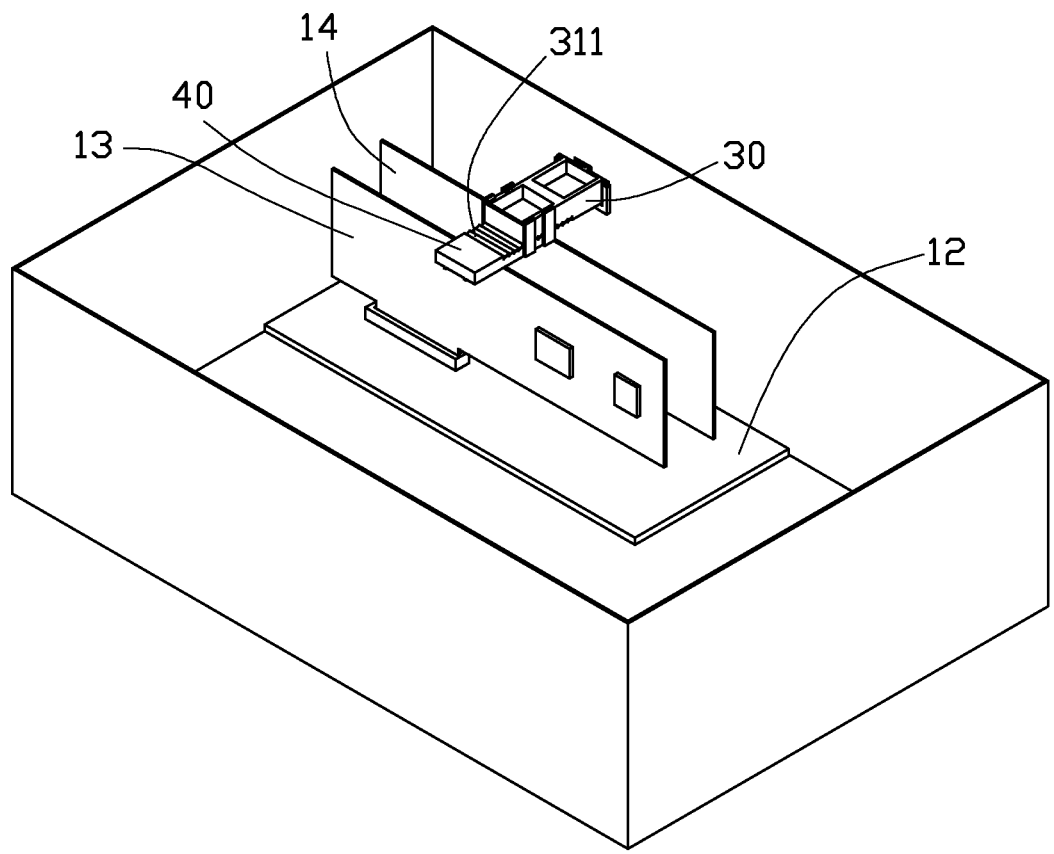
FIG. 4 is similar to FIG. 1, but showing one of the cards in a different position.

It can be understood that the number of cards mounted on the mainboard 12 can be changed in alternative embodiments. Correspondingly, the locking device 20 is capable of securing one card, three cards, or more cards. Additionally, referring to FIG. 4, when the first and second cards 13, 14 are disposed in two nonadjacent slots 120, the fixing member 30 can be operated so that the first teeth 311 engage with different second teeth 411 of the engaging member 40. Thereby, the distance by which the body 41 extends outwardly relative to the main body 31 along the lengthwise direction of the main body 31 is appropriately adjusted. Thus the first and second cards 13, 14 are secured to the box 11 by the locking device 20.

It is to be understood, however, that even though numerous characteristics and advantages of the present embodiments have been set forth in the foregoing description, together with details of the configurations and functions of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A locking device for fixing a card in an electronic device enclosure, the locking device comprising:
   a fixing member adapted for fixing the locking device in the electronic device enclosure, the fixing member comprising a plurality of first teeth; and
   an engaging member comprising a plurality of second teeth matching with the first teeth, a bottom of the engaging member having a cutout defined therein, and the cutout adapted for receiving an edge of the card;
   wherein the engaging member is operable so that the second teeth engage with various of the first teeth as selected by a user, whereby a location of the engaging member is adjustable relative to the location of the fixing member, and thereby the engaging member is capable of engaging with the card when the card is at different locations in the electronic device enclosure; and
   wherein the engaging member further comprises a body, and a plurality of elastic arms respectively extending upwardly from two opposite lateral sides of the body for adjustably engaging with the fixing member, and the second teeth are formed on a top face of the body.

2. The locking device of claim 1, wherein the fixing member comprises a main body, and a flange extending outwardly from an end of the main body, and the first teeth are formed on the main body.

3. The locking device of claim 2, wherein the fixing member further comprises an elastic piece extending upwardly from the end of the main body.

4. The locking device of claim 1, wherein the engaging member further comprises a plurality of baffle ribs extending downwardly from a bottom face of the body, and the cutout is defined between two adjacent of the baffle ribs.

5. The locking device of claim 1, wherein each of the elastic arms comprises an upright portion and a hooking portion extending inwardly from a top end of the upright portion, the fixing member is sandwiched between the upright portions of the elastic arms, and the hooking portions of the elastic arms abut against a top face of the fixing member.

6. The locking device of claim 1, wherein the baffle ribs are aligned with each other.

7. An electronic device enclosure comprising:
   a box;
   a mainboard received in the box, the mainboard having a plurality of slots;
   a card having a bottom end mechanically and electrically fixed in one slot of the mainboard, and an opposite top end; and
   a locking device assembled in the box, the locking device comprising:
      a fixing member fixing the locking device in the electronic device enclosure, the fixing member comprising a plurality of first teeth; and
      an engaging member comprising a plurality of second teeth matching with the first teeth, a bottom of the engaging member having a cutout defined therein, and the cutout adapted for receiving an edge of the card;
   wherein the engaging member is operable so that the second teeth engage with various of the first teeth as selected by a user, whereby a location of the engaging member is adjustable relative to the location of the fixing member, and thereby the engaging member is capable of engaging with the card when the card is at different locations in the electronic device enclosure; and
   wherein the engaging member comprises a body, a plurality of elastic arms respectively extending upwardly from two opposite lateral sides of the body, and a plurality of baffle ribs extending downwardly from a bottom face of the body.

8. The electronic device enclosure of claim 7, wherein the fixing member comprises a main body, and a flange extending outwardly from an end of the main body, the flange being fixed on an inner face of the box.

9. The electronic device enclosure of claim 7, wherein each of the cutouts is defined between every two adjacent baffle ribs.

10. The electronic device enclosure of claim 9, wherein a width of the cutout is equal to that of the card.

11. The electronic device enclosure of claim 9, wherein a distance between every two adjacent cutouts is equal to two adjacent slots of the mainboard.

12. The electronic device enclosure of claim 7, wherein each of the elastic arms comprises an upright portion and a hooking portion extending inwardly from a top end of the upright portion.

13. The electronic device enclosure of claim 12, wherein the fixing member is sandwiched between the upright portions of the elastic arms, the hooking portions of the elastic arms abut against a top face of the fixing member.

14. A locking device for fixing a card in an electronic device enclosure, the locking device comprising:
   a fixing member adapted for fixing the locking device in the electronic device enclosure, the fixing member comprising a plurality of first teeth; and
   an engaging member comprising a plurality of second teeth meshable with the first teeth, a bottom of the engaging member having a cutout defined therein, and the cutout adapted for receiving an edge of the card;
   wherein the engaging member is linearly adjustable relative to the location of the fixing member so that the second teeth are meshed with various selected of the first teeth and thereby the engaging member is capable of engaging with the card when the card is at different locations in the electronic device enclosure; and
   wherein the engaging member comprises a body, a plurality of elastic arms respectively extending upwardly from two opposite lateral sides of the body, and a plurality of baffle ribs extending downwardly from a bottom face of the body, the second teeth are formed on a top face of the body.

15. The locking device of claim 14, wherein the cutout is defined between two adjacent baffle ribs.

16. The locking device of claim 14, wherein each of the elastic arms comprises an upright portion and a hooking portion extending inwardly from a top end of the upright portion, the fixing member is sandwiched between the upright portions of the elastic arms, and the hooking portions of the elastic arms abut against a top face of the fixing member.

17. The locking device of claim 14, wherein the baffle ribs are aligned with each other.

\* \* \* \* \*